US008534976B2

(12) United States Patent
Gertmann et al.

(10) Patent No.: US 8,534,976 B2
(45) Date of Patent: Sep. 17, 2013

(54) APPARATUS FOR PROVIDING A ROTATION CARRIER MAGAZINE, AND METHOD OF OPERATING THEREOF

(75) Inventors: Reiner Gertmann, Linsengericht (DE); Michael König, Frankfurt am Main (DE)

(73) Assignee: Applied Materials Inc., Santa Clara, CA (US)

( * ) Notice: Subject to any disclaimer, the term of this patent is extended or adjusted under 35 U.S.C. 154(b) by 67 days.

(21) Appl. No.: 12/914,113

(22) Filed: Oct. 28, 2010

(65) Prior Publication Data

US 2012/0099949 A1    Apr. 26, 2012

(30) Foreign Application Priority Data

Oct. 25, 2010    (EP) ..................................... 10188749

(51) Int. Cl.
*B65G 49/07*    (2006.01)

(52) U.S. Cl.
USPC .... 414/217; 414/331.05; 414/939; 198/463.3

(58) Field of Classification Search
USPC ..... 414/219, 223.01, 331.05, 220; 198/463.3
See application file for complete search history.

(56) References Cited

U.S. PATENT DOCUMENTS

| | | | | |
|---|---|---|---|---|
| 3,894,926 A | * | 7/1975 | Lee | 204/298.15 |
| 3,931,789 A | * | 1/1976 | Kakei et al. | 118/730 |
| 4,094,722 A | * | 6/1978 | Yamamoto et al. | 156/345.35 |
| 4,483,651 A | * | 11/1984 | Nakane et al. | 414/217 |
| 4,550,239 A | * | 10/1985 | Uehara et al. | 219/121.43 |
| 4,757,355 A | * | 7/1988 | Iizuka et al. | 355/75 |
| 4,759,681 A | * | 7/1988 | Nogami | 414/416.03 |
| 4,793,761 A | * | 12/1988 | Stern | 414/331.05 |
| 4,812,101 A | * | 3/1989 | George et al. | 414/220 |
| 4,867,629 A | * | 9/1989 | Iwasawa et al. | 414/331.05 |
| 4,872,800 A | * | 10/1989 | Gutov et al. | 414/278 |
| 4,890,718 A | * | 1/1990 | Colamussi | 198/465.3 |
| 4,932,357 A | * | 6/1990 | Tamura et al. | 118/715 |
| 4,986,715 A | * | 1/1991 | Asakawa | 414/331.05 |
| 5,233,844 A | * | 8/1993 | Knippscheer et al. | 62/440 |
| 5,275,709 A | * | 1/1994 | Anderle et al. | 204/298.25 |
| 5,382,126 A | * | 1/1995 | Hartig et al. | 414/217 |
| 5,405,231 A | * | 4/1995 | Kronberg | 414/220 |
| 5,501,564 A | * | 3/1996 | Doche | 414/331.13 |
| 5,612,068 A | * | 3/1997 | Kempf et al. | 425/574 |
| 6,196,154 B1 | * | 3/2001 | Baumecker et al. | 118/723 VE |
| 6,357,984 B1 | * | 3/2002 | Zinger et al. | 414/331.05 |
| 6,818,108 B2 | * | 11/2004 | Schertler | 204/298.25 |
| 6,846,146 B2 | * | 1/2005 | Inui | 414/331.05 |

(Continued)

FOREIGN PATENT DOCUMENTS

EP    0339132    11/1988
EP    0435338    12/1990

OTHER PUBLICATIONS

Extended European Search Report dated Mar. 28, 2011 for European Patent Application No. 10188749.5.

*Primary Examiner* — James Keenan
(74) *Attorney, Agent, or Firm* — Patterson & Sheridan, LLP

(57) ABSTRACT

An apparatus for supporting a plurality of carriers or substrates is described. The apparatus includes a vacuum chamber and a rotatable support for supporting the plurality of carriers or substrates, wherein the support is provided within the vacuum chamber and is configured for rotating the supported plurality of carriers or substrates around a rotation axis.

16 Claims, 3 Drawing Sheets

(56) References Cited

U.S. PATENT DOCUMENTS

| | | | |
|---|---|---|---|
| 6,848,876 B2 * | 2/2005 | Babbs et al. | 414/217.1 |
| 7,232,284 B1 * | 6/2007 | Schmutz et al. | 414/217 |
| 7,731,470 B2 * | 6/2010 | Yamamoto | 414/331.05 |
| 2003/0213560 A1 | 11/2003 | Wang et al. | |
| 2007/0041814 A1 * | 2/2007 | Lowe | 414/273 |

* cited by examiner

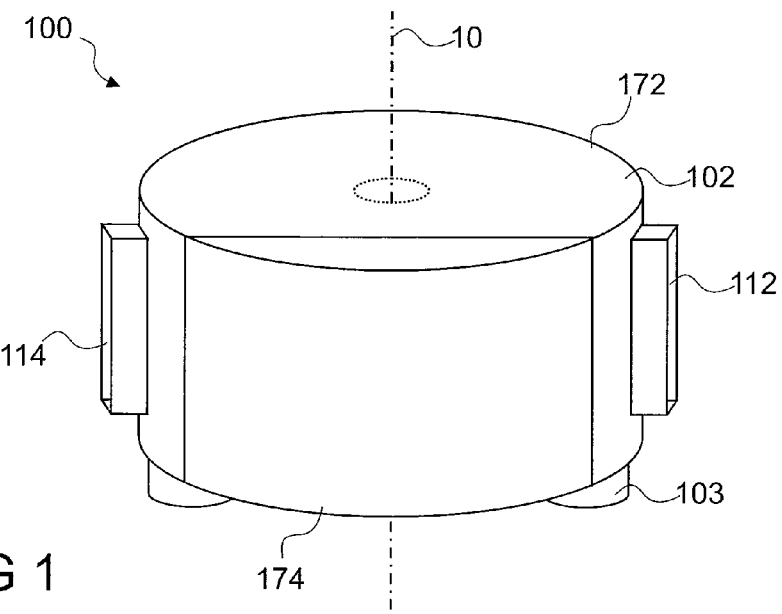
FIG 1
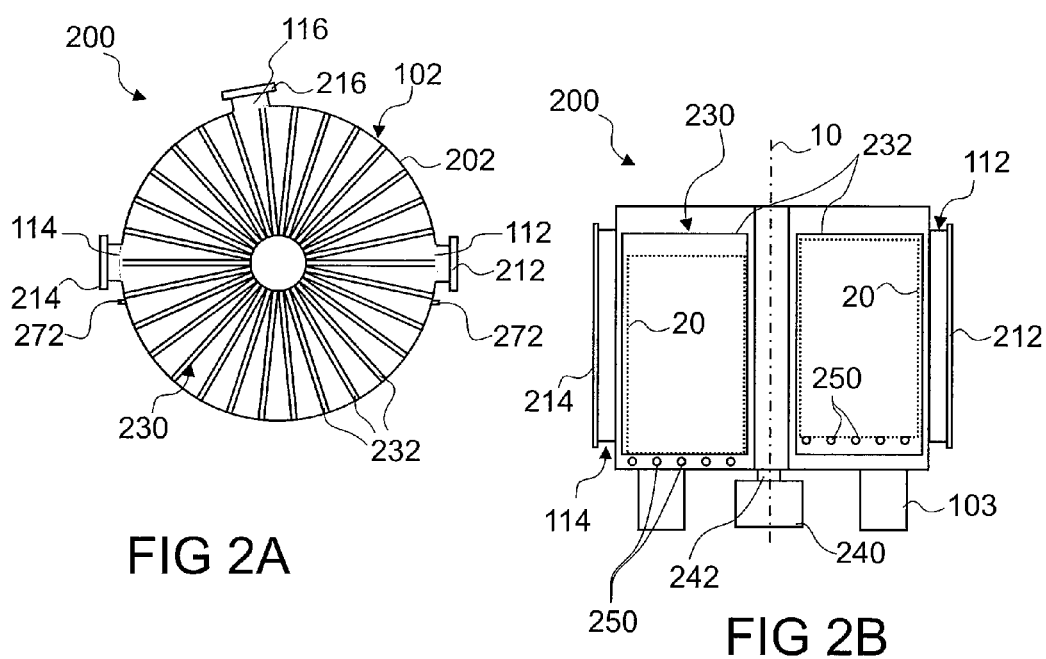
FIG 2A
FIG 2B

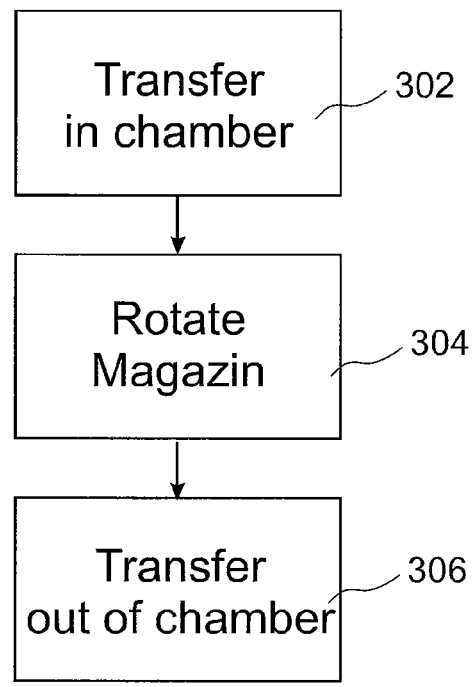
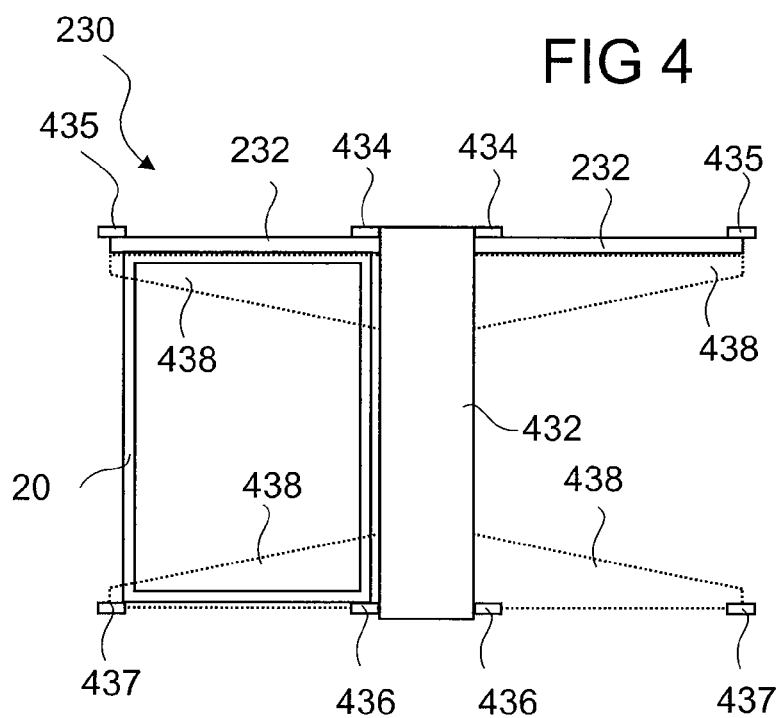

APPARATUS FOR PROVIDING A ROTATION CARRIER MAGAZINE, AND METHOD OF OPERATING THEREOF

BACKGROUND OF THE INVENTION

1. Field of the Invention

Embodiments of the present invention generally relate to support of carriers, substrates, and carriers with substrates, respectively. Particularly they relate to buffering of carriers, substrates and carriers with substrates, respectively. Specifically embodiments of the present invention relate to an apparatus for supporting a plurality of carriers or substrates and a method of operating an apparatus for supporting a plurality of carriers or substrates.

2. Description of the Related Art

In many applications, it is necessary to deposit thin layers on a substrate. Representative examples include (but are not limited to) applications involving: semiconductor and dielectric materials and devices, silicon-based wafers, flat panel displays (such as TFTs), masks and filters, energy conversion and storage (such as photovoltaic cells, fuel cells, and batteries), solid-state lighting (such as LEDs and OLEDs), magnetic and optical storage, micro-electro-mechanical systems (MEMS) and nano-electro-mechanical systems (NEMS), micro-optic and opto-electro-mechanical systems (NEMS), micro-optic and optoelectronic devices, transparent substrates, architectural and automotive glasses, metallization systems for metal and polymer foils and packaging, and micro- and nano-molding.

For many of these applications, particle generation during processing, such as deposition, structuring, or the like, has to be considered and particles, which are not desired on a substrate, may negatively influence subsequent processing steps. Further, particularly for production of mass products, throughput is of increasing importance. Accordingly, providing the substrates to be processed should be conducted as efficient as possible. Thus, buffering of substrates to be processed needs to be improved.

SUMMARY OF THE INVENTION

In light of the above, an apparatus for supporting a plurality of carriers or substrates according to independent claim 1, a system for processing a substrate according to claim 11, and a method of operating an apparatus for supporting a plurality of carriers or substrates in a vacuum chamber according to independent claim 12 are provided.

Embodiments of the invention provide apparatuses and methods for supporting carriers for processing of substrates therein. According to one embodiment, an apparatus for supporting a plurality of carriers or substrates is provided. The apparatus includes a vacuum chamber, and a rotatable support for supporting the plurality of carriers or substrates, wherein the support is provided within the vacuum chamber and is configured for rotating the supported plurality of carriers or substrates around a rotation axis.

According to yet another embodiment, a system for processing a substrate is provided. The system includes a processing chamber, optionally a load lock chamber, and apparatus for supporting a plurality of carriers or substrates. The apparatus includes a vacuum chamber, and a rotatable support for supporting the plurality of carriers or substrates, wherein the support is provided within the vacuum chamber and is configured for rotating the supported plurality of carriers or substrates around a rotation axis.

According to another embodiment, a method of operating an apparatus for supporting a plurality of carriers or substrates in a vacuum chamber is provided. The method includes transferring a carrier or substrate into the apparatus at a first position, rotating the carrier or substrate along with other carriers or substrates of the plurality of carriers or substrates around a rotation axis, and transferring the carrier out of the apparatus at the first position or at a second position different from the first position.

BRIEF DESCRIPTION OF THE DRAWINGS

So that the manner in which the above recited features of the present invention are attained and can be understood in detail, a more particular description of the invention, briefly summarized above, may be had by reference to the embodiments thereof, which are illustrated in the appended drawings.

FIG. 1 is a schematic perspective view of an apparatus for supporting or providing a plurality of carriers or substrates according to embodiments described herein;

FIGS. 2A and 2B are a schematic top-view and a schematic side-view, respectively, of an apparatus for supporting or providing a plurality of carriers or substrates according to further embodiments described herein;

FIG. 3 is a flow-chart illustrating methods of operating an storage apparatus according to embodiments described herein;

FIG. 4 is a view of a rotatable support, such as a magazine or a storage buffer, for supporting or providing a plurality of carriers or substrates according to embodiments described herein;

Figure 5:
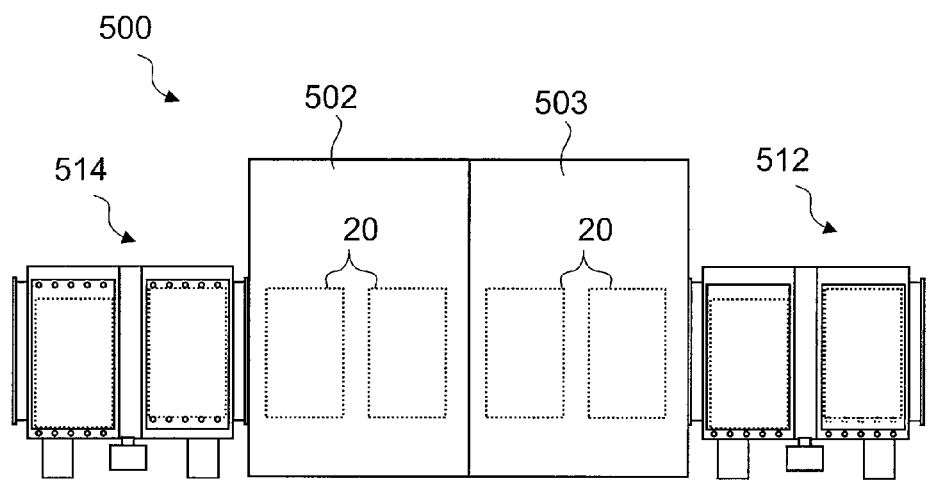
FIG. 5 is a schematic view of a processing system including two apparatuses for supporting or providing a plurality of carriers or substrates according to embodiments described herein.

To facilitate understanding, identical reference numerals have been used, where possible, to designate identical or similar elements that are common to the figures. It is contemplated that elements and features of one embodiment may be beneficially incorporated into other embodiments without further recitation.

It is to be noted, however, that the appended drawings illustrate only exemplary embodiments of this invention and are, therefore, not to be considered limiting of its scope, for the invention may admit to other equally effective embodiments.

DETAILED DESCRIPTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

The term "substrate" as used herein shall embrace substrates, such as a wafer, a transparent substrate, or a glass substrate such as a glass plate, other substrates, which can be used for processing with organic materials, semiconductor materials, metals, or the like.

Typically, substrates to be processed in a processing system, which can include devices for deposition, for etching, for heating, for annealing, for structuring, or the like, are transferred into a processing chamber. Thereby, according to different alternatives, the substrate itself can be transferred or the substrate can be provided within and transferred together with a carrier for supporting and/or masking the substrate within the processing chamber. According to different embodiments, which can be combined with other embodiments described herein, the substrates to be processed can, thus, either be processed with or without a carrier. Examples described herein refer generally to substrate support, substrate buffering, and substrate transfer utilizing a carrier. However, the invention is not limited to the use of carriers and embodiments can also be similarly applied for processing substrates without carrier.

FIG. 1 shows an apparatus 100 for supporting a plurality of carriers or substrates. The apparatus 100 has a magazine or buffer (not shown in FIG. 1) for providing a plurality of carriers or substrates and includes a vacuum chamber 102, which can, for example, be supported by stands 103. As shown in FIG. 1, the storage apparatus 100 has a rotation axis 10, such that the plurality of carriers or substrates can be rotated within the storage apparatus. Thereby, a carrier or a substrate can be inserted in the chamber 102 through the first opening 112, the plurality of carriers can be rotated within the chamber 102 around the rotation axis 10, and the carrier can be transferred out of the chamber 102, for example, through another opening 114.

According to embodiments described herein, a rotatable support, such as a magazine or a storage means can be provided within the chamber 102 and the rotatable support can be rotated such that the plurality of carriers or substrates are rotated around rotation axis 10 and one of the carriers or substrates can be positioned in front of the opening in the chamber 102 for transfer into or out off the chamber. Thus, the rotatable support rotates the plurality of carriers or substrates together around a common axis when the rotatable support is rotated within the chamber 102.

An example of an embodiment of operating an apparatus 100 is shown in FIG. 3. In step 302, the carrier or substrate is transferred into the chamber 102. In step 304 a rotatable support such as a magazine or a storage means, which is exemplarily shown in FIG. 4, can be rotated within the chamber such that in step 306 a carrier or substrate which is positioned in front of one of the openings in the chamber can be transferred out of the chamber through the respective opening.

A rotatable support 230 such as a magazine, a buffer, or a storage means is shown in FIG. 4. One carrier 20 is illustrated to be provided within the support 230. Thereby, the carrier is positioned in a guiding means 232 or in a individual support unit, which can be a slot or another support. Generally, the magazine is rotatable and can, for example, have an n-fold rotation symmetry, wherein n is larger than two.

The magazine has a central shaft 432, an upper, inner rim portion 434 and an upper, outer rim portion 435. Further, the magazine has a lower, inner rim portion 436 and a lower, outer rim portion 437. Typically, the rim portions can be ring-shaped. For example, the rim portions can be connected to the central shaft 432 by the guiding means 232 or by a bar 438. In FIG. 4, the bar 438 is illustrated with dotted lines. This is to be understood such that the bar 438 does not have an angular position with respect to the rotation axis of the rotatable support 230 that is equal to the angular position of the guiding means 232. This is to avoid blocking of the position for the carrier 20, which is to be supported in the guiding means 232. Accordingly, the bars 438 would not be visible in a cross-section through the rotation axis, for which the guiding means 232 would be visible, but are positioned at a different angular position. According to typical embodiments the rotatable storage or buffer can be provided for at least 3 carriers or substrates, particularly at least 10 carriers or substrates or even more carriers or substrates. For examples FIG. 2A shows 30 positions for carriers or substrates. However, also more than 20 or more than 40 carrier or substrates might be provided.

The herein-described embodiments allow for carrier or substrate storage with less space consumption. As compared to linear systems for storing a plurality of carriers, there is no extra space required within the chamber in order to move the carrier or substrate in a transfer position. Further, the carrier storage apparatus can be provided with a vacuum chamber such that the carriers are stored or buffered in a vacuum atmosphere. This reduces existence of undesired particles on the substrates to be processed and allows for outgassing of the carriers and the substrates before the carrier or substrate, respectively, is transferred in the processing chamber.

Accordingly, embodiments described herein allow for a space-saving and flexible supply of a plurality of carriers or substrates. According to typical embodiments, at least 10 carriers or substrates, particularly 20 to 40 carriers or substrates can be provided within the storage apparatus. Thereby, according to yet further embodiments, the reduced space consumption for buffering of substrates can be particularly relevant for large area substrates, such as, for example, Gen 2 substrates or above, Gen 3 substrates or above, Gen 4 substrates or above, or larger substrate generation such as Gen 6, Gen 7.5 or even Gen 10. It can be understood, this concept can also be applied for even larger substrates which might exceed 1 m, 2 m, or even 3 m in one dimension.

According to yet further alternatives, the reduced space consumption for buffering of carriers or substrates can also be provided for buffering under normal pressure or increased pressure. However, typically a vacuum chamber will be provided in order to reduce particles on the substrates to be processed and enable outgassing of the carriers and substrates before the substrates to be processed are transferred in a processing chamber.

FIGS. 2A and 2B show further details of embodiments of an apparatus for supporting a plurality of carriers or substrates. As shown in FIG. 2A, the chamber 102 has a chamber wall 202. Openings 112, 114 and 116 are provided along the circumference of the chamber wall 202. Further, flanges 212, 214, and 216 of provided for connecting the chamber 102 with an adjacent chamber, such as processing chambers or load lock chambers, or with a vacuum pump. Typically, the openings have an elongated shape, as shown in FIG. 1. Thereby, the carriers can be inserted through the openings having an elongated shape, e.g., as a slit-shape. Within the chamber 102, the rotatable support 230 is provided wherein guiding means 232 for guiding or supporting the carriers in a respective position can be included in the rotatable support 230. Thereby, according to embodiments described herein, the rotatable support can have a plurality of individual supports units, which can each support one carrier or substrate. Accordingly, each of the elements 232 provide the position for one carrier or substrate. For example, FIG. 2B shows two carriers 20 at the respective left and right position.

In the example shown in FIG. 2A, a load lock chamber can for example be connected to flange 212, wherein a vacuum-sealed connection is provided between the load lock chamber and the chamber 102. A processing chamber can be connected to flange 214, wherein the vacuum-sealed connection is provided to the processing chamber. A vacuum pump can, for example, be connected to flange 216. According to different alternatives, a connection flange for a vacuum pump can either be a flange corresponding to an elongated opening similar to the openings for insertion of the carriers. Thereby, similar openings and flanges can be used at the two or more of the angular positions. Alternatively, a round opening or another opening, which is adapted for connection to a vacuum pump, can be provided.

Figure 6:
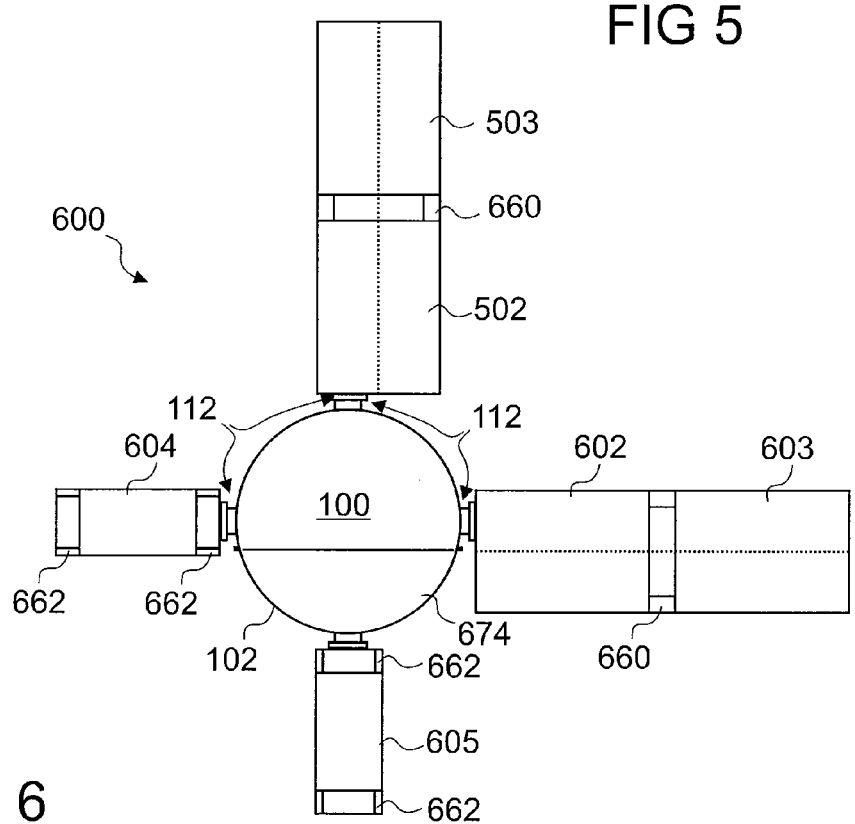
FIG. 6 is a schematic view of yet another processing system including an apparatus for supporting or providing a plurality of carriers or substrates according to embodiments described herein.

As further indicated by flanges 272, which are shown in FIG. 2A, the chamber 102 can have a door portion and a main body (see, e.g., also main body 172 and door portion 174 in FIG. 1, as well as reference numerals 672 and 674 in FIG. 6.) The door portion can be provided as a service door, which removes a portion of the chamber 102 during maintenance or the like. However, during normal operation, the transfer of carriers is conducted through openings in the chamber wall such that, for example, a vacuum can be maintained during operation of the storage apparatus, which includes transfer into and out of the chamber 102.

As further shown in FIG. 2B, the apparatus includes a drive unit 240, which drives a drive shaft 242 that is connected to the rotatable support 230. Accordingly, the rotatable support 230 can be rotated around rotation axis 10. Thereby, the individual carrier support positions, i.e., angular positions with respect to rotation axis 10, can be moved such that carrier or an empty carrier support spot is positioned in front of a respective one of the openings in the chamber 102. If the carrier is positioned in front of an opening, the carrier can be transferred out of the apparatus. If an empty carrier support spot is positioned in front of an opening, a carrier can be transferred into the chamber 102 and positioned in the carrier support unit such as a slot or an alternative individual carrier support unit.

According to some embodiments, which can be combined with other embodiments described herein, at central drives unit can be provided for moving the plurality of carriers (as a group) and for positioning one of the plurality of carriers at a desired position. For transfer of carriers into the magazine or for transfer out of the magazine, a carrier transport system can be provided. According to some embodiments, which can be combined with other embodiments described herein, the transport system can include the plurality of rollers 250. On the left-hand side, i.e., adjacent to opening 114, the transport rollers 250 shown in FIG. 2B are positioned in a lower position. Thereby, the carrier 20 is lowered in its individual support position and is adapted for being rotated during rotation of the magazine. On the right-hand side in FIG. 2B, i.e., adjacent to opening 112, the transport rollers are positioned in an upper position, wherein the carrier 20 is lifted. Thereby, the carrier is moved upwards from its support position and is lifted in order to be configured for a transfer through opening 112. Such a transfer can for example be conducted by rotation of the transport rollers 250. Accordingly, due to the movement of the group of transport rollers, the carrier 20 can be lifted up in a transfer position or can be lowered into the support position. According to yet further embodiments, which can be combined with other embodiments described herein, the transport systems can also be provided by a linear drive coupled to the magnetic system for moving carrier in the radial direction with respect to the rotation axis 10, transport or guiding rollers which can additionally or alternatively be provided at an upper side of the carrier, a sliding guide, or another means for radial movement of a carrier. Thereby, typically lifting of the carrier in a transfer position can be conducted by a set of rollers for lifting, lift-pins, or magnetic element, which uses magnetic forces for moving the carrier 20.

FIG. 5 illustrates embodiments of a processing system. The processing system 500 includes the first storage apparatus 512 and a second storage apparatus 514 according to any of the embodiments described herein. The first storage apparatus 512 is connected to the first processing chamber 503, in which substrates are processed. As shown in FIG. 5, two carriers 20 are provided in the first processing chamber 503. For example, the processing system 500 can be an in-line processing system such that carriers 20 are moved from the storage apparatus 512 into the first processing chamber 503. Further, the carriers 20 having substrates provided therein are continuously moved through chamber 503 and into processing chamber 502, as indicated by the further carriers 20 shown in processing chamber 502. The processed substrates, i.e., the carriers 20 with the processed substrates can then be moved from the second processing chamber 502 into the second storage apparatus 512. Thus, according to the embodiments described herein, the storage apparatus is 512 and 514 can be used for providing a continuous or quasi-continuous flow of substrates or carriers with substrates. According to different embodiments, one or more processing chambers can be provided in a processing system. Typically, the processing chambers can be selected from the group consisting of: a deposition chamber, and heating chamber, an annealing chamber, an etch chamber, or a structuring chamber. According to some modifications, any of the above chambers might also serve for at least one other application. For example, a deposition chamber or an etch chamber can as well be equipped with heating units for heating of substrates therein. According to alternatives embodiments, the invention can also be utilized where a substrate processing is conducted while the substrate to be processed is stationary. Thereby, it is also possible to effectively buffer a plurality of carriers under vacuum conditions and with reduced space consumption.

According to yet further embodiments, as for example shown in FIG. 6, load lock chambers can be provided for transferring carriers into and out of the storage apparatus from the atmosphere at a factory. FIG. 6 shows load lock chamber at 604 and 605. The load lock chambers 604 and 605 are provided with valve unit 662. Thereby, for example, the respective outer valve unit can be opened for insertion of the carrier. After the outer valve unit has been closed, the load lock chamber can be evacuated and the respective inner valve unit can be opened for transfer of the carrier from the load lock chamber into the storage apparatus 100. From the storage apparatus 102 different regions within the processing system 600 for processing of substrates can be chosen. As shown in FIG. 6, a first processing region including processing chambers 502 and 503 and a second processing region including processing chambers 602 and 603 can be provided. The respective processing chambers can also be separated by valve unit 660 in order to allow for separate processing atmospheres between the respective processing chambers during processing of the substrates in one chamber. Even though not shown in FIG. 6, respective valve units can also be provided between the storage apparatus 100 and the respective processing chambers 502 and 602. According to some embodiments, which can be combined with other embodiments described herein, two or more openings 112 can be provided for transferring of carriers into the chamber 102 out of the chamber 102. The example shown in FIG. 6 shows four openings with respective flanges. However, also only one, more than two, more than three or more than four openings can be provided.

For example, for the storage apparatus 100 shown in FIG. 6, a fifth opening can be provided for connecting a vacuum pump to the storage apparatus 100. Thereby, the storage apparatus 100 can be directly evacuated, which might further improved outgassing of the carriers and substrates buffered in the storage apparatus. However, according to a further, the storage apparatus 100 might also be evacuated indirectly via one or both of chambers 502/602. According to yet further embodiments, which can be combined with other embodiments described herein, the storage apparatus can also have only one opening for trespassing of carriers or substrates, such that the storage apparatus is connected to a processing system as a buffer in the processing line and the substrates are transferred in and out of the system elsewhere.

In light of the above, a plurality of embodiments has been described. According to one embodiment, an apparatus for supporting a plurality of carriers or substrates is provided, the apparatus includes a vacuum chamber and a rotatable support for supporting the plurality of carriers or substrates, wherein the support is provided within the vacuum chamber and is configured for rotating the supported plurality of carriers or substrates around a rotation axis. As described in the exemplary embodiments herein, the supported plurality of carriers or substrates can be rotated around a rotation axis when the support is rotated. According to yet further embodiments, which can be combined with other embodiments described herein, the rotatable support can include a carrier magazine, which is rotatably positioned within the vacuum chamber and which comprises a plurality of guiding means; the apparatus may further include a drive unit for rotating the support around the rotation axis; the vacuum chamber can have one or more openings for transferring a carrier or a substrate therethrough; the openings can have an elongated shape with a lengthwise dimension and wherein the lengthwise dimension is parallel to the rotation axis; the apparatus can further include two or more valve units for sealing the one or more openings in the vacuum chamber; and/or the apparatus can further include at least one drive unit for transferring at least one of the plurality of carriers or substrates out of a supporting position or into the supporting position. According to yet further typical implementations, which can be combined with other embodiments described herein, the rotation axis does not intersect the plurality of guiding means; the at least one drive unit can include at least one element selected from the group consisting of: a set of lifting rollers, a magnetic transfer unit, a sliding guide, a set of guiding rollers, and combinations thereof; the vacuum chamber can further include a service door portion, particularly wherein the service door portion is provided with a flange positioned asymmetrically with respect to the rotation axis; and/or the rotatable support is configured for supporting at least 3 or at least 10 carriers or substrates such that the at least 3 or at least 10 carriers or substrate are rotatable within the support around the rotation axis.

According to another embodiment, a substrate processing system is provided. The system includes one or more processing chambers; and an apparatus for supporting a plurality of carriers or substrates according to any of the embodiments described herein.

According to yet another embodiment, a method of operating an apparatus for supporting a plurality of carriers or substrates in a vacuum chamber is provided. The method includes transferring a carrier or substrate into the apparatus at a first position, rotating the carrier or substrate along with other carriers or substrates of the plurality of carriers or substrates around a rotation axis, and transferring the carrier out of the apparatus at the first position or at a second position different from the first position. According to further embodiments, which can be combined with other embodiments described herein, the rotating the carrier can be conducted in a support position and the method further includes moving the carrier or substrate into the support position after the transferring into the apparatus and before the rotating of the carrier, and moving the carrier or substrate out of the support position after the rotating of the carrier and before the transferring out of the apparatus. According to yet further additional or alternative modifications, the apparatus can be an apparatus according to any of the embodiments described herein, and/or the method may further include evacuating the vacuum chamber, particularly evacuating the vacuum chamber before the transfer of the carrier or substrate into the chamber.

While the foregoing is directed to embodiments of the present invention, other and further embodiments of the invention may be devised without departing from the basic scope thereof, and the scope thereof is determined by the claims that follow.

The invention claimed is:

1. An apparatus for supporting a plurality of carriers or substrates, the apparatus comprising:
   a vacuum chamber having one or more openings along the circumference of the chamber wall for transferring a carrier or a substrate therethrough, wherein the carrier includes one or more substrates, and wherein the one or more substrates in the carrier or the substrate comprises a material selected from a group consisting of glass, dielectric and semiconductor materials;
   a rotatable support for supporting the plurality of carriers or substrates, wherein the rotatable support is provided within the vacuum chamber and is configured for rotating the supported plurality of carriers or substrates around a rotation axis, wherein the rotatable support comprises a lower rim portion for supporting lower sides of the carriers or substrates and a plurality of guiding means provided at upper sides of the carriers or substrates; and
   a set of lifting rollers for moving the carrier or substrate upwards from a support position provided by the rotatable support and for lifting the carrier or substrate for a transfer by the set of lifting rollers and by one guiding means of the plurality of guiding means through one of the one or more openings.

2. The apparatus according to claim 1, wherein the rotatable support comprises a carrier magazine, which is rotatably positioned within the vacuum chamber and which comprises the plurality of guiding means.

3. The apparatus according claim 2, wherein the rotation axis does not intersect the plurality of guiding means.

4. The apparatus according to claim 1, further comprising: a drive unit for rotating the support around the rotation axis.

5. The apparatus according to claim 1, wherein the vacuum chamber has two or more openings for transferring a carrier or a substrate therethrough.

6. The apparatus according to claim 1, wherein the one or more openings have an elongated shape with a lengthwise dimension and wherein the lengthwise dimension is parallel to the rotation axis.

7. The apparatus according to claim 1, further comprising: one or more valve units for sealing the one or more openings in the vacuum chamber.

8. The apparatus according to claim 1, further comprising a transport system that includes the set of lifting rollers and the plurality of guiding means, wherein the plurality of guiding means include at least one element selected from the group consisting of a magnetic transfer unit, a sliding guide, a set of guiding rollers, and combinations thereof.

9. The apparatus according to claim 1, wherein the vacuum chamber further comprises a service door portion.

10. The apparatus according to claim 9, wherein the service door portion is provided with a flange positioned asymmetrically with respect to the rotation axis.

11. The apparatus according to claim 1, wherein the rotatable support is configured for supporting at least 3 carriers or substrates such that the at least 3 carriers or substrates are rotatable within the rotatable support around the rotation axis.

12. The apparatus according to claim 1, wherein the rotatable support is configured for supporting at least 10 carriers or substrates such that the at least 10 carriers or substrates are rotatable within the rotatable support around the rotation axis.

13. A substrate processing system, comprising:
   one or more processing chambers; and
   an apparatus for supporting a plurality of carriers or substrates, wherein the carrier includes one or more substrates, and wherein the one or more substrates in the carrier or the substrate comprises a material selected from a group consisting of glass, dielectric and semiconductor materials, and the apparatus comprises:
      a vacuum chamber having one or more openings along the circumference of the chamber wall for transferring a carrier or a substrate therethrough;
      a rotatable support for supporting the plurality of carriers or substrates, wherein the rotatable support is provided within the vacuum chamber and is configured for rotating the supported plurality of carriers or substrates around a rotation axis, wherein the rotatable support comprises a lower rim portion for supporting lower sides of the carriers or substrates and a plurality of guiding means provided at upper sides of the carriers or substrates; and
      a set of lifting rollers for moving the carrier or substrate upwards from a support position provided by the rotatable support and for lifting the carrier or substrate for a transfer by the set of lifting rollers and by one guiding means of the plurality of guiding means through one of the one or more openings.

14. The system according to claim 13, wherein the rotatable support comprises a carrier magazine, which is rotatably positioned within the vacuum chamber and which comprises the plurality of guiding means.

15. A method of operating an apparatus for supporting a plurality of carriers or substrates in a vacuum chamber, the method comprising:
   transferring a carrier or substrate into the apparatus at a first position, wherein the carrier includes one or more substrates, and wherein the one or more substrates in the carrier or the substrate comprises a material selected from a group consisting of glass, dielectric and semiconductor materials;
   lowering the carrier or substrate into a support position;
   rotating the carrier or substrate along with other carriers or substrates of the plurality of carriers or substrates around a rotation axis in the support position;
   lifting the carrier or substrate upwards from the support position; and
   transferring the carrier or substrate out of the apparatus at the first position or at a second position different from the first position, wherein a transfer direction is approximately perpendicular to the rotation axis, and wherein transferring the carrier or substrate comprises transferring the carrier or substrate in the transfer direction by one or more guiding means provided at an upper side of the carrier or substrate, wherein the apparatus comprises:
      a vacuum chamber having one or more openings along the circumference of the chamber wall for transferring a carrier or a substrate therethrough; and
      a rotatable support for supporting a plurality of carriers or substrates, wherein the rotatable support is provided within the vacuum chamber and is configured for rotating the supported plurality of carriers or substrates around a rotation axis, wherein the rotatable support comprises a lower rim portion for supporting lower sides of the carriers or substrates and the one or more guiding means provided at upper sides of the carriers or substrates.

16. The method according to claim 15, further comprising:
   evacuating the vacuum chamber before the transfer of the carrier or substrate into the chamber.

* * * * *